United States Patent [19]

Warringa et al.

[11] 4,119,921

[45] Oct. 10, 1978

[54] AMPLIFIER DEVICE FOR TRANSMITTING TETRODE

[75] Inventors: Jozef Johannus Maria Warringa; Harry Piepers, both of Eindhoven, Netherlands

[73] Assignee: U.S. Philips Corporation, New York, N.Y.

[21] Appl. No.: 792,137

[22] Filed: Apr. 29, 1977

[30] Foreign Application Priority Data

May 3, 1976 [NL] Netherlands .......................... 7604671

[51] Int. Cl.² .............................................. H03F 1/20
[52] U.S. Cl. ........................................ 330/49; 315/39; 330/45
[58] Field of Search .................. 313/297, 298, 301; 330/45, 49; 315/39

[56] References Cited

U.S. PATENT DOCUMENTS

| | | | |
|---|---|---|---|
| 2,485,400 | 10/1949 | McArthur | 330/45 |
| 2,514,925 | 7/1950 | Beggs | 315/39 X |
| 3,742,292 | 6/1973 | Gerlach | 315/39 |

*Primary Examiner*—Lawrence J. Dahl
*Attorney, Agent, or Firm*—Frank R. Trifari; Algy Tamoshunas

[57] ABSTRACT

Amplifier device for the UHF-TV band, assembled from cylindrical conductors which are coaxially arranged with respect to one another and connected to a tetrode. The screen grid is grounded and the control grid is provided with dc voltage connecting terminals required for setting the tetrode.

6 Claims, 1 Drawing Figure

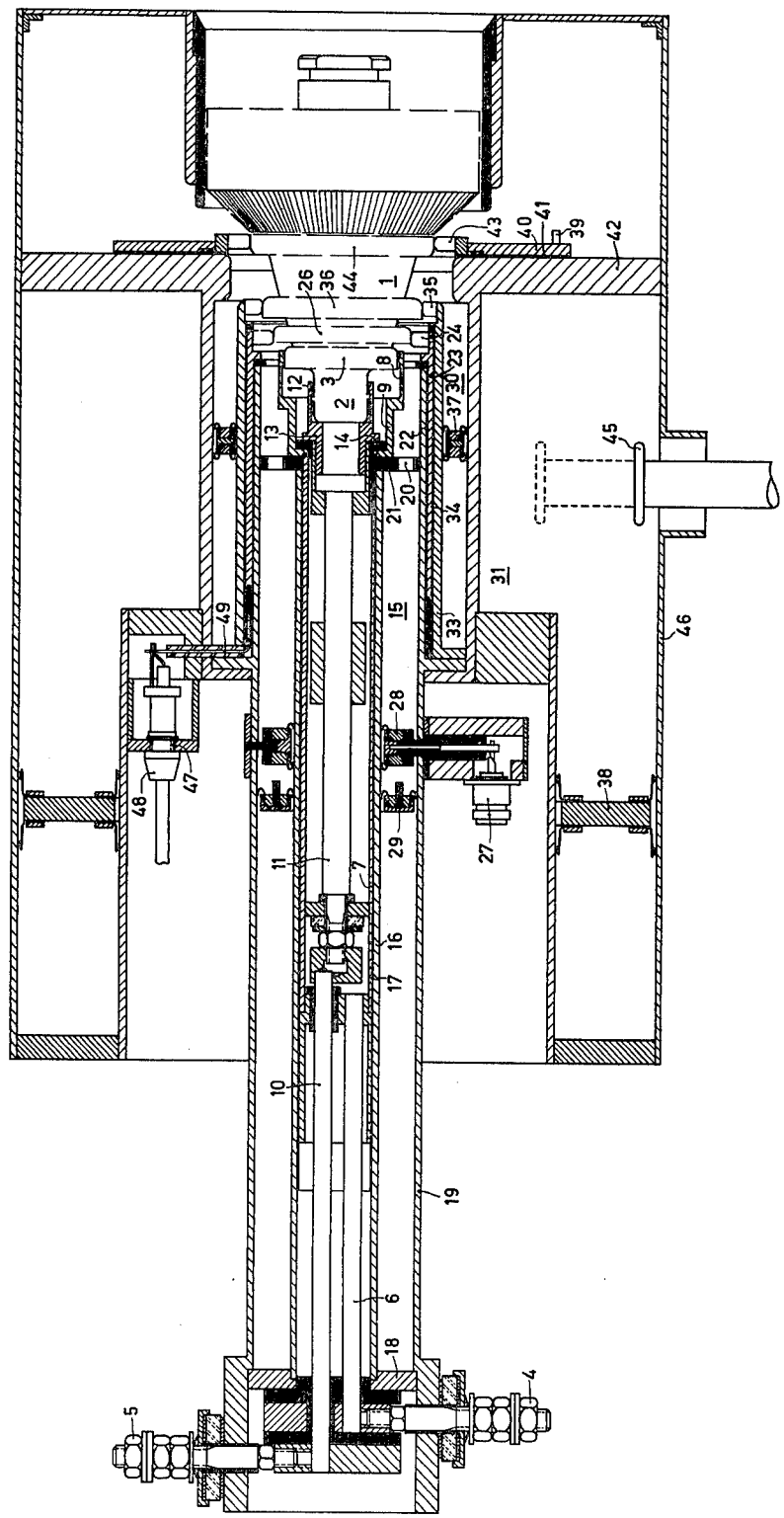

AMPLIFIER DEVICE FOR TRANSMITTING TETRODE

The invention relates to an amplifier device for a transmitting tetrode having an operating frequency in the frequency range of 470–1000 MHz comprising a plurality of coaxial, mutually insulated, cylindrical conductors, which are provided at one end with the contacts for connecting the transmitting tetrode electrodes.

Such amplifier devices are used in TV transmitters.

With prior art devices operating in the UHF range the cylindrical conductor which is provided with contacts for connecting the control electrodes of the tetrode is connected to a terminal of common potential. The cylindrical conductors which are provided with contacts for connecting the cathode, the screen grid and the anode, have connecting terminals which are insulated with respect to the common potential and supply to the respective electrodes the adjusting potentials required for setting the tetrode. Such a device is large in size.

It is an object of the invention to provide a new concept.

The device in accordance with the invention comprises a cylindrical conductor provided with contacts for connecting the screen grid of the tetrode to a terminal of common potential and a cylindrical conductor provided with contacts for connecting the control grid of the tetrode to a terminal which is insulated from the common potential and which is connected to a source of dc voltage required for setting the tetrode.

The advantage of grounding the screen grid is that such an arrangement avoids the capacitance between the leads to that grid and the grounded envelope present in the prior art constructions.

The arrangement of the invention has an additional advantage in that it also obviates the need for the tunable circuit which serves to compensate for the influence of the capacitance on the operation of the tube used in the prior art devices. Elimination of the tunable circuit which in the prior art devices is arranged between the screen and control grid make it possible to significantly reduce the transverse dimension of the amplifier. The reduced dimension enables the plunger in the cylindrical resonator cavity forming the anode tuning circuit of the output circuit to be positioned within $\frac{1}{4}\lambda$ from the contacts for the connections of the screen grid and the anode. This not only significantly reduces the height of the amplifier device but in addition results in a higher gain factor.

The invention and its advantages will be further explained with reference to the embodiment shown in the FIGURE.

The FIGURE shows an amplifier device and a tetrode 1 arranged therein. The cathode of the tetrode comprises a connecting cap 2 and a first connecting ring 3 with the heater of the tetrode connected therebetween. To supply the heater with current, the amplifier device is provided with connecting terminals 4 and 5. Terminal 4 is connected to the connecting ring 3 via a conductor 6, a first cylindrical conductor 7 and spring-fitted contacts 8 of a dish 9. Terminal 5 is connected to the connecting cap 2 via a conductor 10, a central conductor 11 and spring-fitted contacts 12 of a dish 13. The dish 13 is retained in dish 9 by an insulating ring 14.

The amplifier device is provided with an input circuit which is designed as a coaxial resonator cavity 15. The inner conductor 16 of the resonator cavity 15 is capacitively coupled to conductor 7 via an insulating coating 17 and at the bottom connected to the outer conductor 19 via a conducting ring 18. In addition, the dish 9 is retained by means of a ring-shaped insulator which is provided with holes 20 and bears against the outer conductor 19.

Disposed about the top portion of the coaxial resonator cavity is a cylindrical conductor 23 which is capacitively coupled to the conductor 19 via an insulating coating 22. Conductor 23 is connected to the connecting ring 26 of the control grid of the tetrode 1 via a contact ring 24.

The frequency of the input circuit is adjustable between 470 MHz and 1000 MHz by means of an axially displaceable ring-shaped plunger 29 which is arranged in the resonator cavity 15.

The signal to be amplified is supplied to the cavity resonator 15 via an input terminal 27 and a ring 28 connected thereto. The ring is axially displaceable for optimum adjustment at a given operating frequency of the coupling between the input terminal 27 and the resonator cavity 15 at a given operating frequency.

The field pattern of the oscillation produced in the coaxial resonator cavity 15 is of such a shape that the electric field lines at the open top end extend via the capacitive couplings 7, 17, 16 and 19, 22, 23 from the contacts 8 to the contact ring 24 so that the signal to be amplified is connected between control grid 26 and cathode 3 of the tetrode.

In addition, the amplifier device is provided with an output band-pass filter formed by the coaxial resonator cavities 30 and 31 which are coupled to each other in a manner not shown in the drawing.

By means of an insulating coating 34, the inner conductor 33 of the resonator cavity is insulated from conductor 23 and is connected via a contact ring 35 to the connecting ring 36 of the screen grid of the tetrode 1. The resonator cavity 30 and the resonator cavity 31 are each provided with a ring-shaped plunger 37 and 38, respectively, for tuning the output band-pass filter to an operating in the frequency band of 470 MHz to 1000 MHz.

The anode is supplied with the dc voltage required for adjusting the tetrode 1 via connecting terminal 39. Terminal 39 is connected to the anode via a ring-shaped conductor 40, which is separated by an insulating coating 41 from the upper cover 42 of the resonator cavity 31, via a ring-shaped contact 43 and the connecting ring 44.

The signal amplified by the amplifier device is derived by means of a probe 45 from the resonator cavity 31 of the band-pass filter.

In accordance with the invention, conductor 23 is conductively connected to the other components of the amplifier device which are at a common or ground potential, such as the outermost conductors 19 and 46. This has the advantage that the screen grid has no envelope capacitance with respect to ground, which would be in series with the output band-pass filter. The screen grid is capacitively coupled to the control grid by means of the capacitance between the conductors 19 and 22. However this capacitance is in series with the input circuit and therefore is passed through only by the input power. This low power does not pose extreme requirements to the insulating coating 22 between the conductors 22 and 23.

In accordance with the invention, furthermore, the conductor 23 is provided with a connecting terminal 48 which is mounted in an insulated manner by means of a feed-through capacitor 47. The control grid is supplied with the dc voltage required for setting the tetrode via terminal 48 and conductor 49, conductor 23 and contact ring 24.

As the FIGURE shows the spacing between conductors 23 and 33 is very small.

This arrangement makes possible a small radial spacing for the entire height of the resonator cavity 30 so that the disturbing influence of the open top end had very little influence on the field pattern in the resonator cavity. This promotes, on the one hand, the generation of a pure mode of oscillation and, on the other hand, permits the tuning plunger 37 to be displaced to a point near the open top end so that the length of the resonator cavity is effectively utilized to a $\frac{1}{4}\lambda$ at 1000 MHz. Positioning the tuning plunger at a point such that the effective length of the cavity is $\frac{1}{4}\lambda$ results in a relatively large bandwidth and a large gain.

What is claimed is:

1. A device for amplifying signals in the frequency band of 470 to 1000 MHz comprising a tetrode having an anode, a cathode, a screen grid and a control grid, a first and second coaxial cylindrical conductor defining a resonant input cavity therebetween, means for supplying to said input cavity a signal to be amplified, a third cylindrical conductor coaxial with and insulated from said first and second conductors, means for connecting said third conductor to a source of dc voltage, means for connecting said third conductor to said control grid to thereby supply said control grid with dc voltage, a fourth cylindrical conductor coaxial with and insulated from said third conductor, at least one additional cylindrical conductor coaxial with and surrounding at least a portion of said fourth conductor, said additional conductor being spaced from and defining with said fourth conductor a resonant output cavity therebetween, means for grounding said fourth conductor and further means for connecting said fourth conductor to said screen grid to thereby ground said screen grid and reduce capacitance between said screen grid and said output cavity, means for extracting the amplified signal from said output cavity, means for connecting said anode to a source of dc voltage and terminal means for connecting said cathode to a source of heating current.

2. The device according to claim 1 including a further cylindrical conductor coaxial with said additional conductor, said further conductor and said additional conductor defining a further resonant cavity therebetween, said further resonant cavity and said output cavity forming an output band-pass filter.

3. The device according to claim 1 wherein said further connecting means includes contacts on the end of said fourth conductor adjacent said tetrode for connecting said fourth conductor to said screen grid.

4. The device according to claim 3 including an axially displaceable plunger disposed between said fourth and said additional conductors for tuning said output cavity, said plunger being moveable to a position such that the effective length of said output cavity is a quarter wavelength at a frequency included in said 470 to 1000 MHz band.

5. The device according to claim 1 wherein said fourth conductor is disposed about and separated from said third conductor by a relatively thin insulating coating therebetween, and said third conductor is disposed about the end portion of said second conductor adjacent said tetrode and separated from said second conductor by an additional relatively thin insulating coating therebetween, said first conductor being the innermost conductor of said cylindrical conductors.

6. The device according to claim 5 including an axially displaceable plunger disposed in each of said input and output cavities for tuning the respective cavities.

* * * * *